(12) United States Patent
Huang (10) Patent No.: US 9,750,148 B1
(45) Date of Patent: Aug. 29, 2017

(54) ANTI-TAMPER MECHANISM AND ELECTRONIC DEVICE USING THE SAME

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventor: Ying-Jui Huang, New Taipei (TW)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/204,111

(22) Filed: Jul. 7, 2016

(30) Foreign Application Priority Data

May 24, 2016 (TW) .............................. 105116172 A (51) Int. Cl.
*H05K 5/02* (2006.01)
*H05K 7/14* (2006.01)

(52) U.S. Cl.
CPC ......... *H05K 5/0208* (2013.01); *H05K 7/1417* (2013.01); *H05K 7/1427* (2013.01)

(58) Field of Classification Search
CPC .. H05K 5/0208; H05K 7/1417; H05K 7/1427; H05K 5/0013; H05K 5/0047
See application file for complete search history.

(56) References Cited

U.S. PATENT DOCUMENTS

| 2005/0128723 | A1* | 6/2005 | Chen | H05K 7/1417 361/801 |
| 2014/0071643 | A1* | 3/2014 | Yang | H05K 5/0208 361/755 |
| 2015/0237751 | A1* | 8/2015 | Lee | H05K 5/0247 361/752 |
| 2016/0055355 | A1* | 2/2016 | Huang | G06F 21/87 726/34 |

(Continued)

FOREIGN PATENT DOCUMENTS

| CN | 205038651 U | 2/2016 |
| TW | I415554 B | 11/2013 |
| TW | I507858 B | 11/2015 |

*Primary Examiner* — Sherman Ng
(74) *Attorney, Agent, or Firm* — Steven Reiss (57) ABSTRACT

An anti-tamper mechanism to disable an electronic device during unauthorized physical access includes: a turnover assembly, spring, turnover member, conducting members, and a latch. The turnover body defines a plurality of receiving grooves. Several conducting members are received in the plurality of receiving spaces in a certain and predefined order to enable electrical coupling with the circuit board. The latch includes a supporting bracket, a guiding rod slidably positioned on the supporting bracket, and a latching member positioned on the guiding rod. The latching member engages with the turnover body to hold the turnover member in check, but when the latching member disengages from the turnover body in disassembly, the turnover member displaces the conducting members thereby destroying the certain and predefined order and electrical decouples the circuit board to disable the electronic device.

20 Claims, 6 Drawing Sheets

(56) References Cited

U.S. PATENT DOCUMENTS

2016/0055356 A1* 2/2016 Huang .................... G06F 21/88
      726/35
2016/0066444 A1* 3/2016 Fan .................... H01R 12/7076
      439/78

* cited by examiner

ANTI-TAMPER MECHANISM AND ELECTRONIC DEVICE USING THE SAME

FIELD

The subject matter herein generally relates to physical security of electronic devices.

BACKGROUND

An electronic device should have protection against physical interference without an authorization, as well as data hacking. The principle is that when an opening operation is detected by a circuit board, a stop operation can be started.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

Generally, the present disclosure is described in relation to an anti-tamper mechanism, assembly, and housing configured to physically protect an electronic device comprising a circuit board, and to protect the electronic device from unauthorized access.

The anti-tamper mechanism comprises a turnover assembly. The turnover assembly comprises a support, and a turnover member rotatably coupled to the support. The turnover member comprises a turnover body. The turnover body defines a plurality of receiving spaces. The turnover assembly comprises a torsion member positioned between the support and the turnover member; and a plurality of conducting members. Each conducting member is received in one of the plurality of receiving spaces in a certain and predefined order, and further configured to thereby electrically couple with the circuit board to cause the circuit board to turn on. The anti-tamper mechanism comprises a latching assembly. The latching assembly comprises a supporting bracket, a guiding rod slidably positioned on the supporting bracket, and a latching member positioned on the guiding rod. When the latching member engages with the turnover body, the turnover member prevents the plurality of conducting members from being displaced. When the latching member disengages from the turnover body, the turnover member is driven by the torsion member to displace the plurality of conducting members thereby destroying the predefined order needed to electrically coupling the circuit board and preventing the circuit board from turning on.

The present disclosure is also described in relation to an electronic device having the anti-tamper device. The electronic device comprises a housing, and a circuit board positioned in the housing. The circuit board comprises a plurality of conductive rubber cushions, an abutting member, and the anti-tamper mechanism previously described is positioned in the housing.

Figure 1:
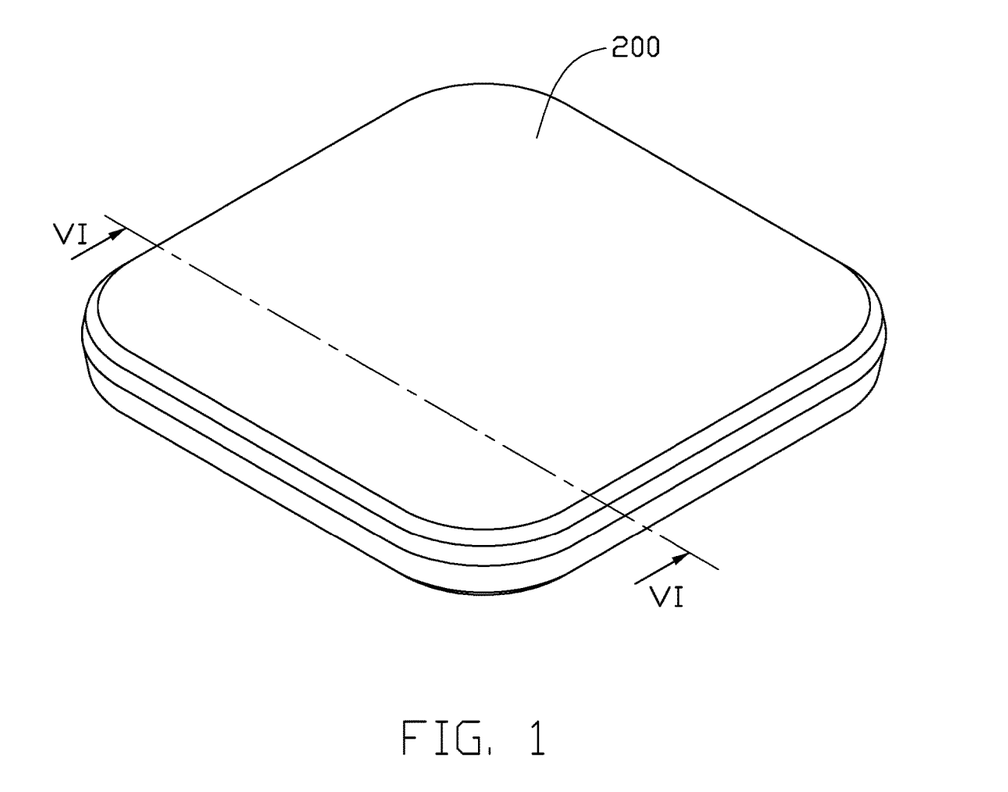
FIG. 1 is an isometric view of an electronic device with an anti-tamper protection mechanism.
Figure 2:
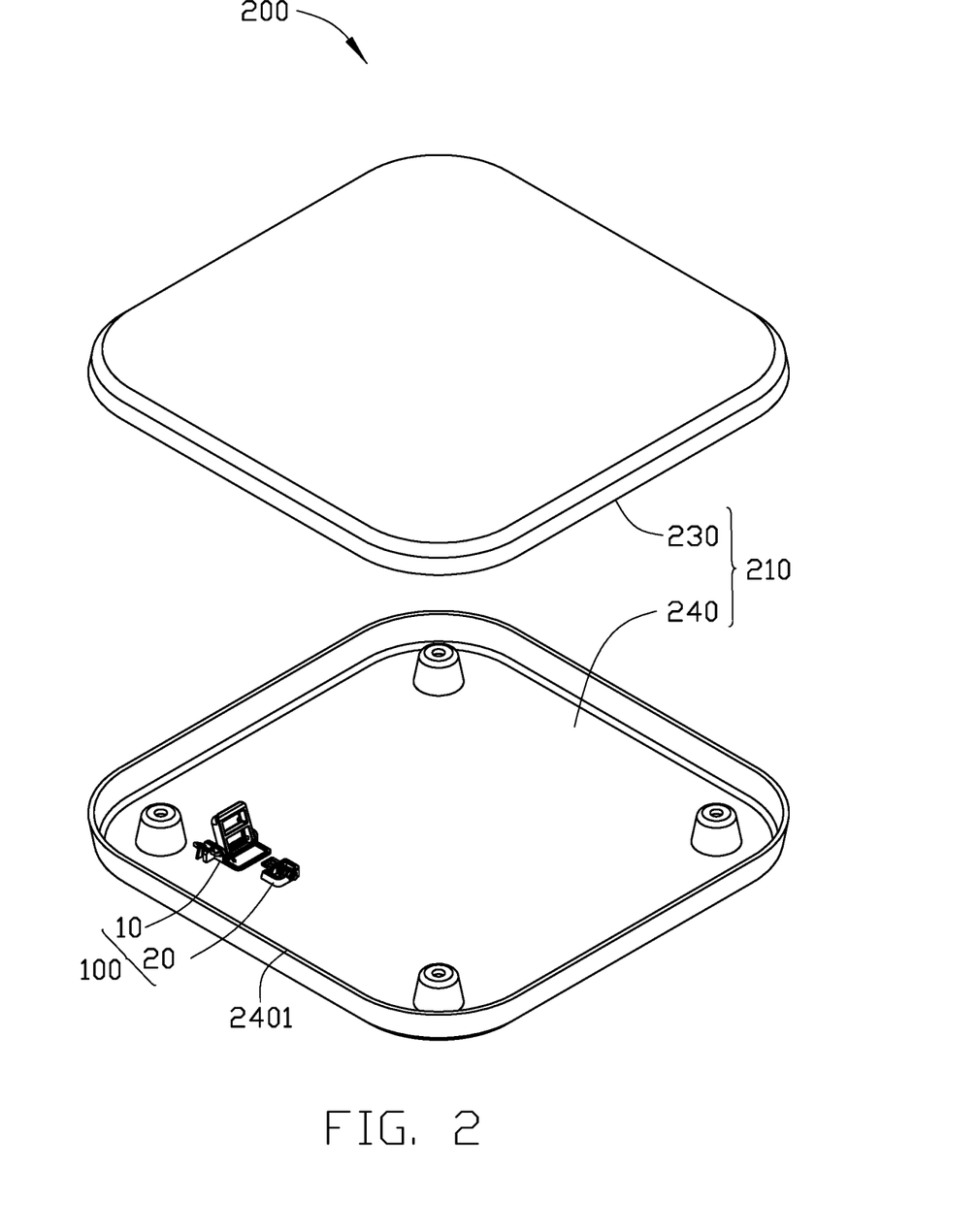
FIG. 2 is an exploded, isometric view of the electronic device shown in FIG. 1.
Figure 3:
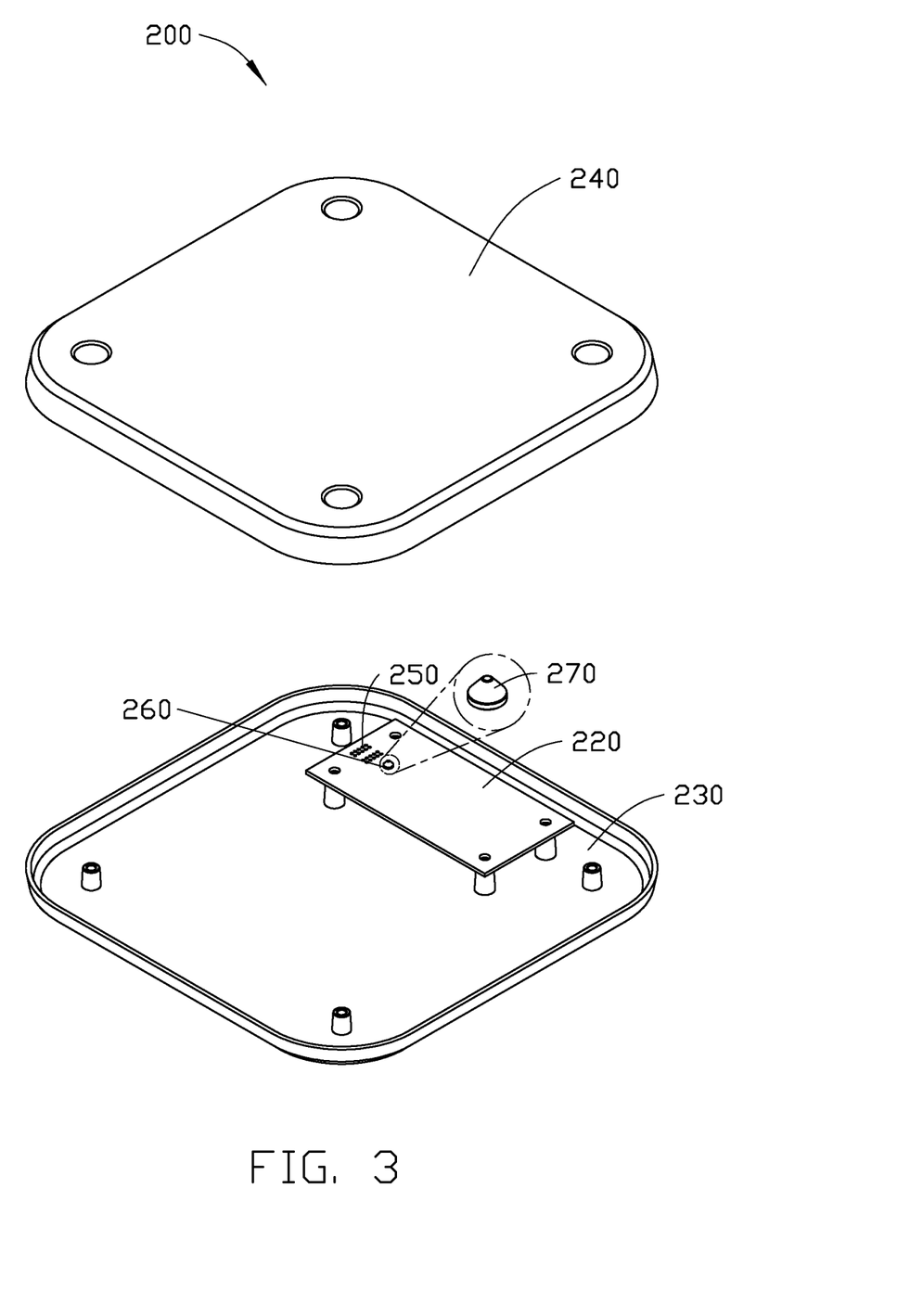
FIG. 3 is an exploded, isometric view of the electronic device shown in FIG. 1 from another view.

FIG. 1 illustrates an electronic device 200 having an enclosure with an anti-tamper mechanism which will now be described. Referring to FIG. 2, the electronic device 200 can include a housing 210. The housing 210 can include a first housing 230 and a second housing 240 opposite to the first housing 230 and for being connected with the first housing 230. Referring to FIG. 3, the electronic device 200 can further include a circuit board 220 mounted in the housing 210. The circuit board 220 can be located between the first housing 230 and the second housing 240, and positioned on an inner surface of the first housing 230. The circuit board 220 can support a number of conductive rubber cushions 250 and an abutting member 260. The conductive rubber cushions 250 can be arranged in arrays. The abutting member 260 can be perpendicular to a plane of the circuit board 220. The abutting member 260 can include an abutting portion 270 positioned on one end thereof spaced from the circuit board 220. The abutting portion 270 can be, but is not limited to be, cone-shaped. In at least one embodiment, the electronic device 200 can further include other functional components which are not described.

Referring to FIG. 2, the electronic device 200 can include an anti-tamper mechanism 100. The anti-tamper mechanism 100 can be positioned on an inner surface of the second housing 240. The anti-tamper mechanism 100 can include a turnover assembly 10 spaced nearer to a periphery 2401 of the second housing 240 than the middle of the second housing 240 and a latching assembly 20, similarly close to the periphery 2401 of the second housing 240 and facing the turnover assembly 10.

Figure 4:
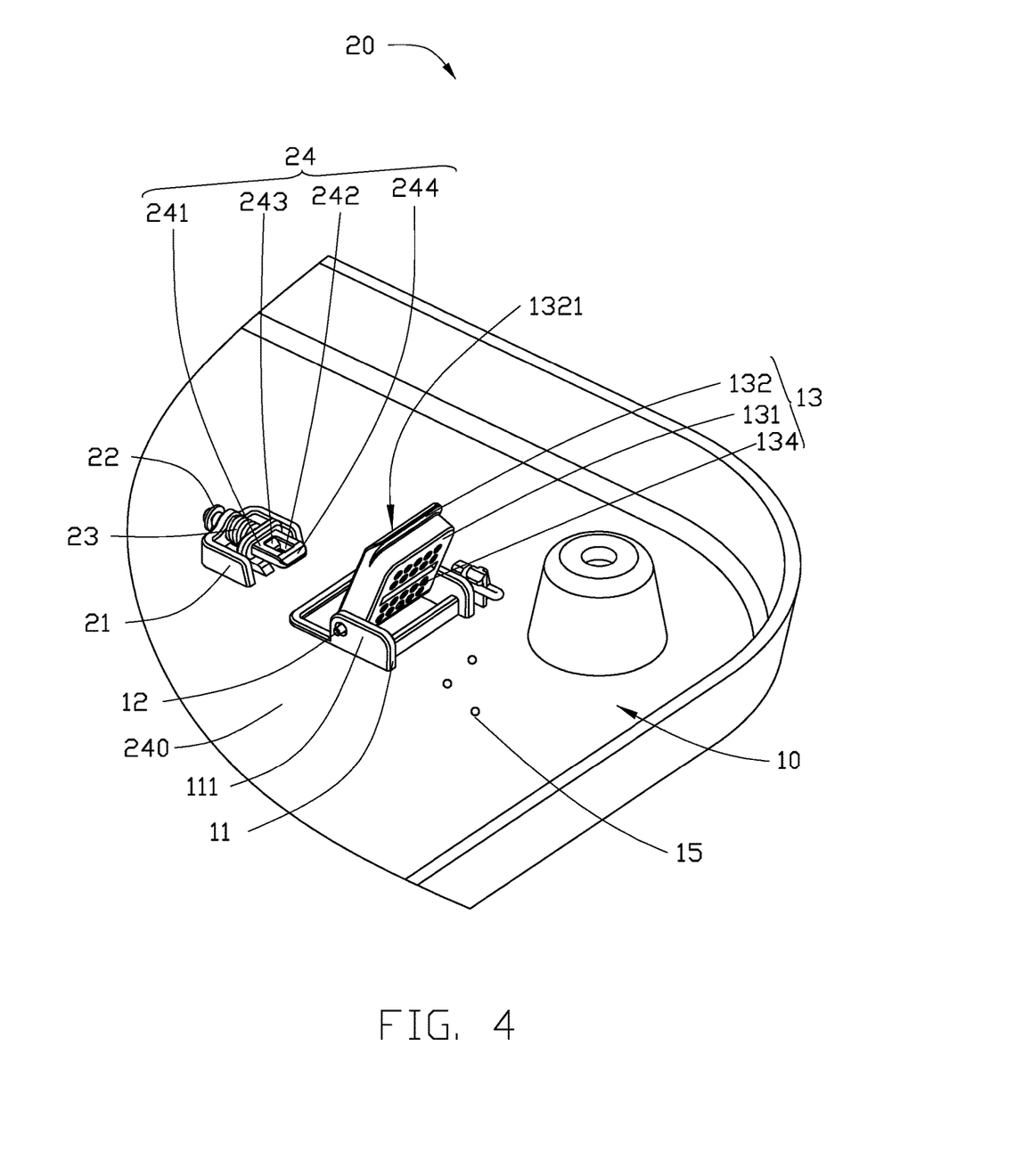
FIG. 4 is a partial, enlarged, isometric view of a second housing having an anti-tamper mechanism.
Figure 5:
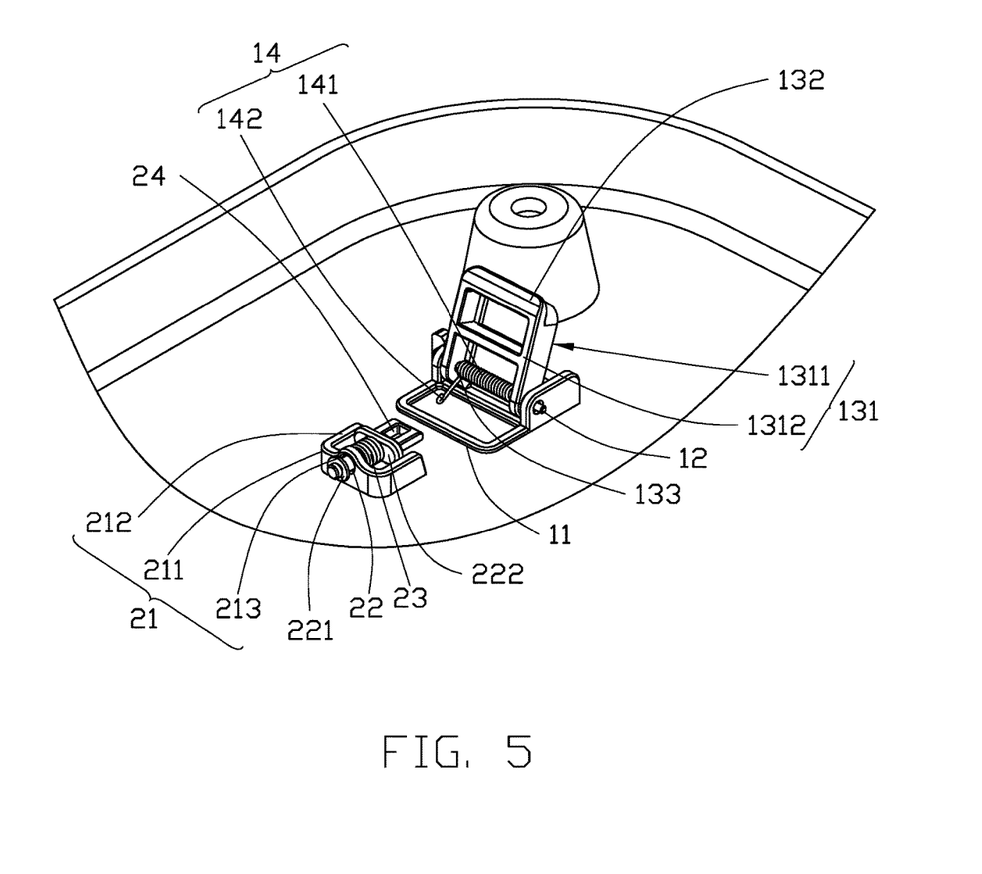
FIG. 5 is a partial isometric view of the second housing of FIG. 4 from another view.

Referring to FIGS. 4 and 5, the turnover assembly 10 can include a support 11, a pivot 12, a turnover member 13, a torsion member 14, and a number of conducting members 15. The support 11 can be positioned on the inner surface of the second housing 240. The support 11 can include two lugs 111 protruding from the inner surface of the second housing 240. The turnover member 13 can be rotatably coupled to the support 11 by the pivot 12. The turnover member 13 can include a turnover body 131 and a hook 132 positioned on one free end of the turnover body 131. The turnover member 13 can define pivot holes 133 (as shown in FIG. 5) on the other end of the turnover body 131 and a number of receiving spaces 134 adjacent to the hinged end of the turnover body 131, close to the second housing 240. The pivot 12 can pass through the pivot holes 133 and further be rotatably coupled to the support 11, such that the turnover member 13 can be rotatably coupled to the support 11. The turnover member 13 can rotate about the pivot 12.

Figure 6:
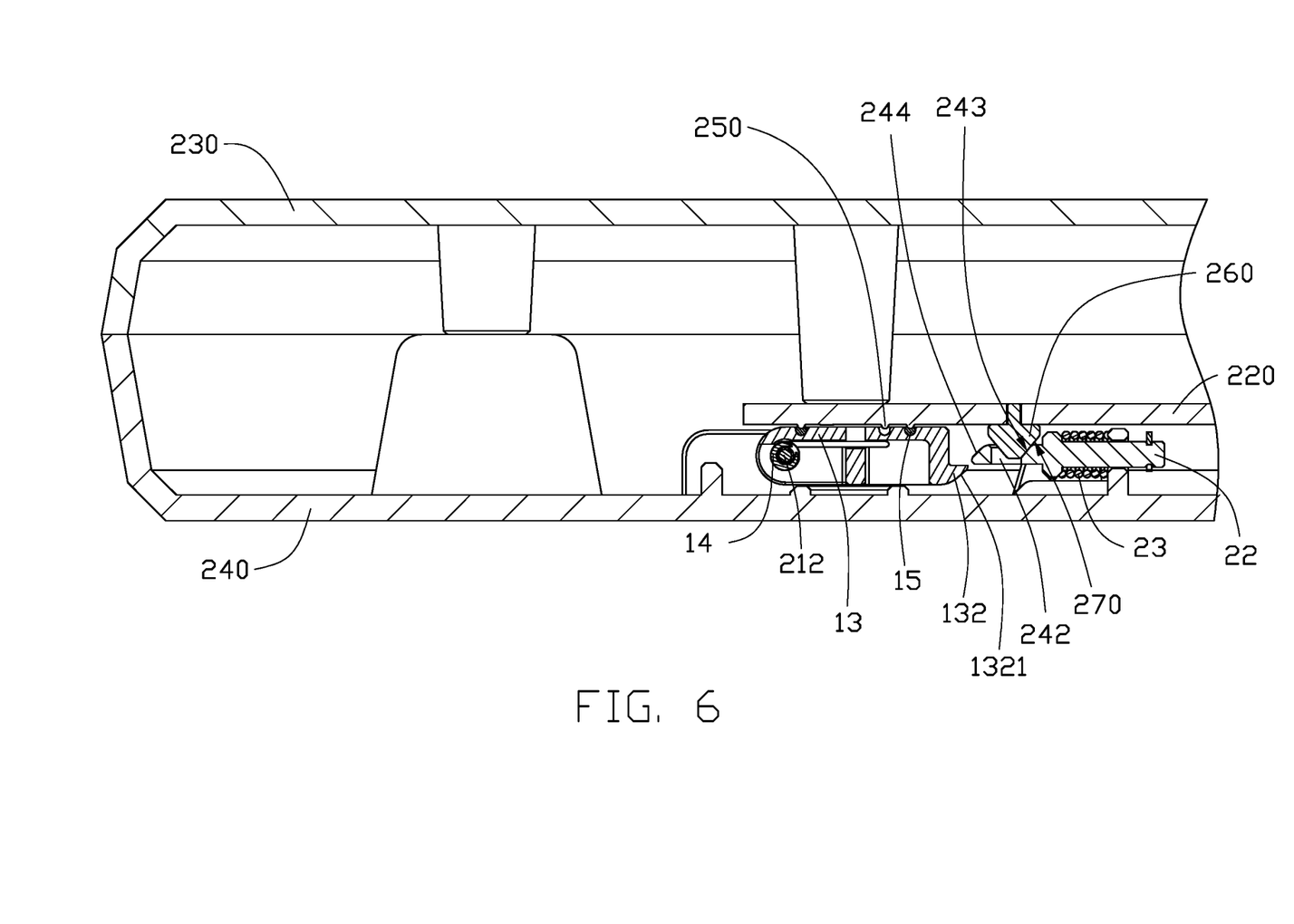
FIG. 6 is a cross-sectional view of the electronic device shown in FIG. 1 taken along line VI-VI.

Referring to FIG. 5, the turnover body 131 can include a first surface 1311 and a second surface 1312 opposite to the first surface 1311. The hook 132 can be L-shaped. The hook 132 can have an first inclined surface 1321 (as shown in FIG. 4) located on the turnover body 131 opposite from the pivot 12 and further coupled to the second surface 1312. The first inclined surface 1321 and the second surface 1312 need not be parallel, thus the inclined surface 1321 may slope upwards or downwards along the edge of the hook 132 (as shown in FIG. 6). Similarly, the angle of the hook 132 can be greater than or less than 90 degrees for receiving the turnover member 13. The receiving spaces 134 can be defined in the first surface 1311. The receiving spaces 134 can be arranged in an array. Each receiving space 134 can correspond to one of the conductive rubber cushions 250.

The torsion member 14 can be positioned on the pivot 12. The torsion member 14 can include a torsion body 141 and two abutment parts 142 positioned on opposite sides of the torsion body 141. The torsion body 141 can cover the pivot 12. One abutment part 142 can abut the support 11, and the other abutment part 142 can abut the turnover body 131. The torsion member 14 can provide torsion force for the turnover member 13. The conducting members 15 can be arranged in the receiving spaces 134 in a predefined and certain order. The predefined order for arranging the conducting members 15 to turn on the electronic device 200 can be pre-stored in the electronic device 200. The conducting members 15 can be less than the receiving spaces 134.

When the conducting members 15 are arranged on the circuit board 220 in the predefined order, each conducting member 15 can abut one of the conductive rubber cushions 250 to cause the circuit board 220 to turn on. When the conducting members 15 are not arranged on the circuit board 220 in the predefined order, each conducting member 15 can abut one of the conductive rubber cushions 250 but the circuit board 220 cannot turn on.

In at least one embodiment, the torsion member 14 can be but is not limited to be a torsional spring.

In at least one embodiment, the conducting members 15 can be, but are not limited to be, ball-shaped.

Referring to FIGS. 4 and 5, the latching assembly 20 can include a supporting bracket 21, a guiding rod 22 positioned on the supporting bracket 21, an elastic member 23 covers the guiding rod 22, and a latching member 24 (FIG. 6) positioned on the guiding rod 22.

The supporting bracket 21 can be substantially U-shaped. The supporting bracket 21 can include a first bracket portion 211 and a second bracket portion 212 extending out in parallel from the two ends of the first bracket portion 211. The supporting bracket 21 can define a mount hole 213 centrally located in the first bracket portion 211. The two second bracket portions 212 can cooperatively form a guide space (not labeled).

The guiding rod 22 can be received in the guide space, located between the two second bracket portions 212, and can slidably pass through the mount hole 213. On one end, the guiding rod 22 can include a blocking member 221 and a connecting member 222 located on the other end thereof. The blocking member 221 and the connecting member 222 can be configured to prevent the guiding rod 22 from sliding out of the mount hole 213.

The elastic member 23 can abut the connecting member 222 and the first bracket portion 211 such that the guiding rod 22 can be driven to move relative to the mount hole 213 by elastic force of the elastic member 23.

The latching member 24 can be positioned on the connecting member 222 and further coupled to one end of the guiding rod 22. Referring to FIG. 4, the latching member 24 can include a latching body 241. The latching body 241 can define a though hole 242. The latching body 241 can include an abutting surface 243 adjacent to the through hole 242, and an second inclined surface 244 adjacent to the through hole 242 and spaced apart from the abutting surface 243. The through hole 242 can be centrally located in the latching body 241. In this embodiment, the abutting surface 243 can extend from a surface of the latching body 241 to the through hole 242. The abutting surface 243 can abut the abutting portion 270 (shown in FIG. 6). The second inclined surface 244 can be located on one end of the latching body 241 spaced from the guiding rod 22. The second inclined surface 244 can engage with the first inclined surface 1321 of the hook 132. In at least one embodiment, the elastic member 23 can be but is not limited to be a spring.

Referring to FIGS. 2-6, the support 11 can be positioned on the second housing 240. The pivot 12 can pass through the pivot holes 133, pass through the torsion member 14, and be further rotatably coupled to the support 11. The two abutment parts 142 can abut the second housing 240 and the turnover member 13. The supporting bracket 21 can be positioned on the inner surface of the second housing 240. The connecting member 222 can be positioned in the supporting bracket 21. The elastic member 23 abuts the supporting bracket 21 and the connecting member 222. The elastic member 23 can cover the guiding rod 22. One end of the guiding rod 22 can pass through the mount hole 213, and be coupled with the blocking member 221. The other end of the guiding rod 22 can pass through the connecting member 222 and be further coupled with the one end of the latching member 24. The turnover member 13 can be driven to rotate about the pivot 12 to cause the torsion member 14 to be compressed by the turnover member 13, such that the second inclined surface 244 can engage with the first inclined surface 1321. The guiding rod 22 is spaced from the turnover member 13 and causes the elastic member 23 to become compressed when driven to move. When the second inclined surface 244 engages with the first inclined surface 1321, an elastic restoring force of the elastic member 23 can drive the guiding rod 22 to move close to the turnover member 13, such that the latching member 24 can engage with the hook 132, preventing the turnover member 13 from turning over.

When the first and second housings 230 and 240 are uncoupled, each conducting member 15 can be received in one of the receiving spaces 134. The circuit board 220 couples to the conducting members 15 once the first housing 230 covers the second housing 240, such that each conducting member 15 can correspond to one of the conductive rubber cushions 250. The abutting member 260 can engage in the through hole 242, and further engage with the abutting surface 243, such that the latching member 24 can be driven to move spaced from the turnover member 13 and disengage from the hook 132 (shown in FIG. 6). The turnover member 13 is spaced from the support 11 and can be driven to rotate by the torsion member 14. The turnover member 13 further abuts the circuit board 220, and each conducting member 15 can abut one of the conductive rubber cushions 250 thereby enabling the circuit board 220 to be turned on.

When the first housing 230 is removed from the second housing 240, the turnover member 13 can be driven to rotate about the pivot 12 and move away from the support 11, such that the conducting members 15 can be displaced by the turnover member 13, and the circuit board 220 can be thus turned off. A person who does not know the predefined order cannot assembly the conducting members 15 in the predefined order, and the circuit board 220 cannot be turned on again, and an anti-tamper function can be thus achieved.

In at least one embodiment, the pivot 12 can be omitted, the turnover member 13 can be pivoted to the support 11 directly.

In at least one embodiment, the hook 132 and the pivot holes 133 can be omitted. the turnover member 13 can be pivoted to the support 11 directly, and the turnover body 131 can engage with the latching member 24 directly.

In at least one embodiment, the elastic member 23 can be omitted.

In at least one embodiment, the through hole 242 and the second inclined surface 244 can be omitted, the abutting surface 243 can be positioned on the latching body 241 directly.

In at least one embodiment, the connecting member 222 can be omitted, the latching member 24 can be coupled to the guiding rod 22 directly, and the elastic member 23 can abut the latching member 24 directly.

The embodiments shown and described above are only examples. Many details are often found in the art such as the features of anti-tamper mechanism and electronic device using the same. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. An anti-tamper mechanism, of an electronic device having a circuit board; the anti-tamper mechanism comprising:
   a turnover assembly comprising:
      a support;
      a turnover member rotatably coupled to the support and comprising a turnover body, the turnover body defining a plurality of receiving spaces;
      a torsion member positioned between the support and the turnover member; and
   a plurality of conducting members, each conducting member receiving in one of the plurality of receiving spaces in a predefined order, and further configured to electrically couple with the circuit board; and
   a latching assembly comprising:
      a supporting bracket;
      a guiding rod slidably positioned on the supporting bracket, and
      a latching member positioned on the guiding rod;
   wherein when the latching member engages with the turnover body, the turnover member prevents the plurality of conducting members from being displaced; and
   wherein when the latching member disengages from the turnover body, the turnover member is driven by the torsion member to displace the plurality of conducting members thereby destroying the predefined order.

2. The anti-tamper mechanism of claim 1, wherein the turnover assembly further comprises a pivot positioned on the support, the turnover member is rotatably coupled to the pivot.

3. The anti-tamper mechanism of claim 2, wherein the turnover member further comprises a hook positioned on one end of the turnover body and defines pivot holes at each side of the other end of the turnover body, the turnover body has a first surface and a second surface opposite to the first surface, the plurality of receiving spaces are defined on the first surface, the hook has a first inclined surface coupled to the second surface, the hook is capable of engaging with the latching member, the pivot passes through the pivot holes such that the turnover member is capable of rotating relative to the support.

4. The anti-tamper mechanism of claim 2, wherein the torsion member comprises a torsion body and two abutment parts positioned on two opposite sides of the torsion body, the torsion body covers the pivot, one of the two abutment parts abuts the support, and the other of the two abutment parts abuts the turnover body.

5. The anti-tamper mechanism of claim 1, wherein the supporting bracket comprises a first bracket portion and a second bracket portion coupled to and extending in parallel from the two ends of the first bracket portion, the supporting bracket defines a mount hole on the first bracket portion, the guiding rod locates between the two second bracket portions, and slidably passes through the mount hole.

6. The anti-tamper mechanism of claim 5, wherein the latching assembly further comprises an elastic member covering the guiding rod, the two ends of the elastic member abut the latching member and the first bracket portion respectively such that the guiding rod is driven to move relative to the mount hole by elastic force of the elastic member.

7. The anti-tamper mechanism of claim 6, wherein the guiding rod comprises a blocking member located on one end thereof and a connecting member located on the other end thereof, the blocking member and the connecting member are configured to prevent the guiding rod from sliding out the mount hole, and one end of the elastic member abuts the connecting member.

8. The anti-tamper mechanism of claim 1, wherein the latching member comprises a latching body, the latching body defines a though hole and comprises an abutting surface adjacent to the through hole, and a second inclined surface adjacent to the through hole and spaced apart from the abutting surface, the second inclined surface locates on one end of the latching body spaced from the guiding rod, the second inclined surface engages with the first inclined surface of the hook to prevent the turnover body from turning over.

9. The anti-tamper mechanism of claim 8, wherein the circuit board comprises an abutting member with an abutting portion, and wherein the through hole of the latching body is defined centrally located in the latching body, the abutting surface extends from a surface of the latching body to the through hole, the abutting surface is capable of abutting with an abutting portion of the circuit board.

10. An electronic device, comprising:
a housing;
a circuit board positioned in the housing, the circuit board comprising a plurality of conductive rubber cushions and an abutting member; and
an anti-tamper mechanism positioned in the housing, the anti-tamper mechanism comprising:
a turnover assembly, the turnover assembly comprising:
a support;
a turnover member rotatably coupled to the support comprising a turnover body, the turnover body defining a plurality of receiving spaces;
a torsion member positioned between the support and the turnover member; and
a plurality of conducting members, each conducting member receiving in one of the plurality of receiving spaces in a predefined order, and further electrically coupled with one of the plurality of conductive rubber cushions to turn on the circuit board; and
a latching assembly comprising:
a supporting bracket;
a guiding rod slidably positioned on the supporting bracket, and
a latching member positioned on the guiding rod;
wherein when the latching member engages with the turnover body, the turnover member prevents the plurality of conducting members from being displaced;
wherein when the latching member is driven to disengage from the turnover body by the abutting member, the turnover member is driven by the torsion member to displace the plurality of conducting members thereby destroying the predefined order.

11. The electronic device of claim 10, wherein the housing comprises a first housing and a second housing opposite to the first housing and covering the first housing, the circuit board is positioned on the first housing, the anti-tamper mechanism is positioned on the second housing.

12. The electronic device of claim 10, wherein the abutting member comprises an abutting portion positioned on one end thereof spaced from the circuit board, the abutting portion is capable of driving the latching member to disengage from the turnover body.

13. The electronic device of claim 10, wherein the turnover assembly further comprises a pivot positioned on the support, the turnover member is rotatably coupled to the pivot.

14. The electronic device of claim 13, wherein the turnover member further comprises a hook positioned on one end of the turnover body and defines pivot holes at each side of the other end of the turnover body, the turnover body has a first surface and a second surface opposite to the first surface, the plurality of receiving spaces are defined on the first surface, the hook has a first inclined surface coupled to the second surface, the hook is capable of engaging with the latching member, the pivot passes through the pivot holes such that the turnover member is capable of rotating relative to the support.

15. The electronic device of claim 13, wherein the torsion member comprises a torsion body and two abutment parts positioned on two opposite sides of the torsion body, the torsion body covers the pivot, one of the two abutment parts abuts the support, and the other of the two abutment parts abuts the turnover body.

16. The electronic device of claim 10, wherein the supporting bracket comprises a first bracket portion and a second bracket portion coupled to and extending in parallel from the two ends of the first bracket portion, the supporting bracket defines a mount hole on the first bracket portion, the guiding rod locates between the two second bracket portions, and slidably passes through the mount hole.

17. The electronic device of claim 16, wherein the latching assembly further comprises an elastic member covering the guiding rod, the two ends of the elastic member abut the latching member and the first bracket portion respectively such that the guiding rod is driven to move relative to the mount hole by elastic force of the elastic member.

18. The electronic device of claim 17, wherein the guiding rod comprises a blocking member located on one end thereof and a connecting member located on the other end thereof, the blocking member and the connecting member are configured to prevent the guiding rod from sliding out the mount hole, and one end of the elastic member abuts the connecting member.

19. The electronic device of claim 10, wherein the latching member comprises a latching body, the latching body defines a though hole and comprises an abutting surface adjacent to the through hole, and an second inclined surface adjacent to the through hole and spaced apart from the abutting surface, the second inclined surface locates on one end of the latching body away from the guiding rod, the second inclined surface engages with the first inclined surface of the hook to prevent the turnover body from turning over.

20. The electronic device of claim 19, wherein the through hole of the latching body is defined centrally located in the latching body, the abutting surface extends from a surface of the latching body to the through hole, the abutting surface is capable of abutting with an abutting portion of the circuit board.

* * * * *